US012217937B2

United States Patent
Khaja et al.

(10) Patent No.: US 12,217,937 B2
(45) Date of Patent: Feb. 4, 2025

(54) RADIO FREQUENCY SOURCE FOR INDUCTIVELY COUPLED AND CAPACITIVELY COUPLED PLASMAS IN SUBSTRATE PROCESSING CHAMBERS

(71) Applicant: Applied Materials, Inc., Santa Clara, CA (US)

(72) Inventors: Abdul Aziz Khaja, San Jose, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 17/693,409

(22) Filed: Mar. 13, 2022

(65) Prior Publication Data

US 2023/0317411 A1    Oct. 5, 2023

(51) Int. Cl.
 *H01J 37/32* (2006.01)

(52) U.S. Cl.
 CPC ...... *H01J 37/321* (2013.01); *H01J 37/32183* (2013.01); *H01J 37/32357* (2013.01); *H01J 37/32862* (2013.01); *H01J 2237/332* (2013.01); *H01J 2237/334* (2013.01)

(58) Field of Classification Search
 CPC .......... H01J 37/321; H01J 37/32183; H01J 37/32357; H01J 37/32862; H01J 2237/332; H01J 2237/334
 See application file for complete search history.

(56) References Cited

U.S. PATENT DOCUMENTS

| | | | |
|---|---|---|---|
| 5,812,361 A * | 9/1998 | Jones | H01L 21/6833 279/128 |
| 10,211,052 B1 * | 2/2019 | Buckalew | H01L 21/32051 |
| 10,773,282 B2 * | 9/2020 | Coppa | H01J 37/32697 |
| 2002/0101167 A1 | 8/2002 | Shan et al. | |
| 2004/0037973 A1 | 2/2004 | Li et al. | |
| 2011/0277784 A1 | 11/2011 | Dhindsa | |
| 2014/0209244 A1 * | 7/2014 | Banna | H01J 37/321 156/345.49 |
| 2016/0049323 A1 | 2/2016 | Ye et al. | |
| 2016/0086772 A1 | 3/2016 | Khaja et al. | |
| 2020/0043709 A1 * | 2/2020 | Agarwal | C23C 16/45544 |
| 2020/0328064 A1 * | 10/2020 | Bin Budiman | H01J 37/32568 |
| 2021/0257188 A1 * | 8/2021 | Juco | H01J 37/32183 |
| 2023/0298857 A1 * | 9/2023 | Bhowmick | H01J 37/32183 315/111.21 |

OTHER PUBLICATIONS

Application No. PCT/US2023/064207, International Search Report and the Written Opinion, Mailed on Jun. 27, 2023, 9 pages.

\* cited by examiner

*Primary Examiner* — Tung X Le

(74) *Attorney, Agent, or Firm* — Kilpatrick Townsend & Stockton LLP

(57) ABSTRACT

A radio frequency (RF) source may be used to generate a capacitively coupled plasma to perform a plasma-based process on a substrate in a plasma processing chamber. A controller may cause the RF source and a switching element to route an RF signal to electrodes in the pedestal that generate the plasma in the processing chamber as part of a recipe performed on a substrate during etch or deposition processes. Between processes, the controller may cause the same RF source to generate a second RF signal that is instead routed by the switching element to inductive coils to generate an inductively coupled plasma for a cleaning process to remove film deposits on the interior of the plasma processing chamber.

20 Claims, 12 Drawing Sheets

RADIO FREQUENCY SOURCE FOR INDUCTIVELY COUPLED AND CAPACITIVELY COUPLED PLASMAS IN SUBSTRATE PROCESSING CHAMBERS

TECHNICAL FIELD

This disclosure is generally related to a radio frequency source for generating multiple plasmas in a chamber. More specifically, this disclosure describes a radio frequency source that is configured to generate capacitively coupled plasmas during substrate processes and inductively coupled plasmas during cleaning processes.

BACKGROUND

In the fabrication of modern semiconductor devices, plasma-based chemical vapor deposition (PECVD) another plasma-based processes may be commonly employed for the formation of thins film on a semiconductor substrate or etching material from a surface of a substrate. For example, plasma processes in a PECVD chamber generally promote the disassociation of reactant gases that are distributed across a substrate surface during the PECVD process. Specifically, the application of radio frequency (RF) energy to the reaction zone proximate the substrate surface can create a plasma of highly reactive ionic species, thereby reducing the energy required for a chemical reaction to take place on the substrate surface and lowering the required temperature for a particular CVD process.

SUMMARY

In some embodiments, a system may include a plasma processing chamber, a Radio Frequency (RF) source, and a controller configured to perform operations including receiving an indication of a plasma process to be performed on a substrate in a plasma processing chamber; causing the RF source to generate a first RF signal configured to generate a capacitively coupled plasma in the plasma processing chamber during the plasma process performed on the substrate; receiving an indication of a cleaning process to be performed in the plasma processing chamber; and causing the RF source to generate a second RF signal configured to generate an inductively coupled plasma in the plasma processing chamber during the cleaning process.

In some embodiments, a method of using a single Radio-Frequency (RF) source to generate inductively coupled plasmas and capacitively coupled plasmas in plasma processing chambers may include receiving an indication of a plasma process to be performed on a substrate in a plasma processing chamber; causing an RF source to generate a first RF signal configured to generate a capacitively coupled plasma in the plasma processing chamber during the plasma process performed on the substrate; receiving an indication of a cleaning process to be performed in the plasma processing chamber; and causing the RF source to generate a second RF signal configured to generate an inductively coupled plasma in the plasma processing chamber during the cleaning process.

In some embodiments, one or more non-transitory computer-readable media may include instructions that, when executed by one or more processors, cause the one or more processors to perform operations including receiving an indication of a plasma process to be performed on a substrate in a plasma processing chamber; causing a Radio-Frequency (RF) source to generate a first RF signal configured to generate a capacitively coupled plasma in the plasma processing chamber during the plasma process performed on the substrate; receiving an indication of a cleaning process to be performed in the plasma processing chamber; and causing the RF source to generate a second RF signal configured to generate an inductively coupled plasma in the plasma processing chamber during the cleaning process.

In any embodiments, any and all of the following features may be implemented in any combination and without limitation. The system may further include a switching element coupled to an output of the RF source. The method/operations may also include causing the switching element to route the first RF signal to one or more electrodes in a pedestal of the plasma processing chamber during the plasma process performed on the substrate to generate the capacitively coupled plasma. The method/operations may also include causing the switching element to route the second RF signal to inductive coils during the cleaning process to generate the inductively coupled plasma. The system may also include a remote plasma generator, where the second RF signal may be routed to the remote plasma generator to generate the inductively coupled plasma. The system may also include inductive coils positioned around a gas mixing region of the plasma processing chamber, where the second RF signal may be routed to the inductive coils to generate the inductively coupled plasma in the gas mixing region. The system may also include inductive coils positioned in a pedestal of the plasma processing chamber, where the second RF signal may be routed to the inductive coils to generate the inductively coupled plasma in a processing volume of the plasma processing chamber. The system may also include a first RF matching circuit configured to match an impedance of the capacitively coupled plasma during the plasma process performed on the substrate, where the first RF signal may be routed through the first RF matching circuit. The system may also include a second RF matching circuit configured to match an impedance of the inductively coupled plasma during the cleaning process, where the second RF signal may be routed through the second RF matching circuit. The system may also include comprising an RF matching circuit, and the method/operations may also include causing the RF matching circuit to match impedance of either the inductively coupled plasma or the capacitively coupled plasma depending on whether the plasma process is being performed on the substrate or the cleaning process is being executed. The first RF signal may be routed to an electrode in a lid assembly of the plasma processing chamber. A pedestal of the plasma processing chamber may include a ground connection through which the first RF signal is grounded after generating the capacitively coupled plasma. The RF source may be shared between a plurality of plasma processing chambers. The RF source may generate both the capacitively coupled plasma and the inductively coupled plasma without requiring an additional RF source. The one or more processors may be distributed between different computing systems. The instructions may be part of one or more recipes executed on a batch of substrates in the plasma processing chamber. The method/operations may also include causing a switching element to route the first RF signal to one or more electrodes in a pedestal of the plasma processing chamber during the plasma process performed on the substrate to generate the capacitively coupled plasma, and causing the switching element to route the second RF signal to inductive coils or a remote plasma generator during the cleaning process to generate the inductively coupled plasma. The method/operations may also include causing one or more RF matching circuits to match an impedance of either the inductively coupled plasma or the capacitively coupled plasma depending on whether the plasma process is being performed on the substrate or the cleaning process is being executed.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

A radio frequency (RF) source may be used to generate a capacitively coupled plasma to perform a plasma-based process on a substrate in a plasma processing chamber. A controller may cause the RF source and a switching element to route an RF signal to electrodes in the pedestal that generate the plasma in the processing chamber as part of a recipe performed on a substrate during etch or deposition processes. Between processes, the controller may cause the same RF source to generate a second RF signal that is instead routed by the switching element to inductive coils to generate an inductively coupled plasma for a cleaning process to remove film deposits on the interior of the plasma processing chamber.

Figure 1:
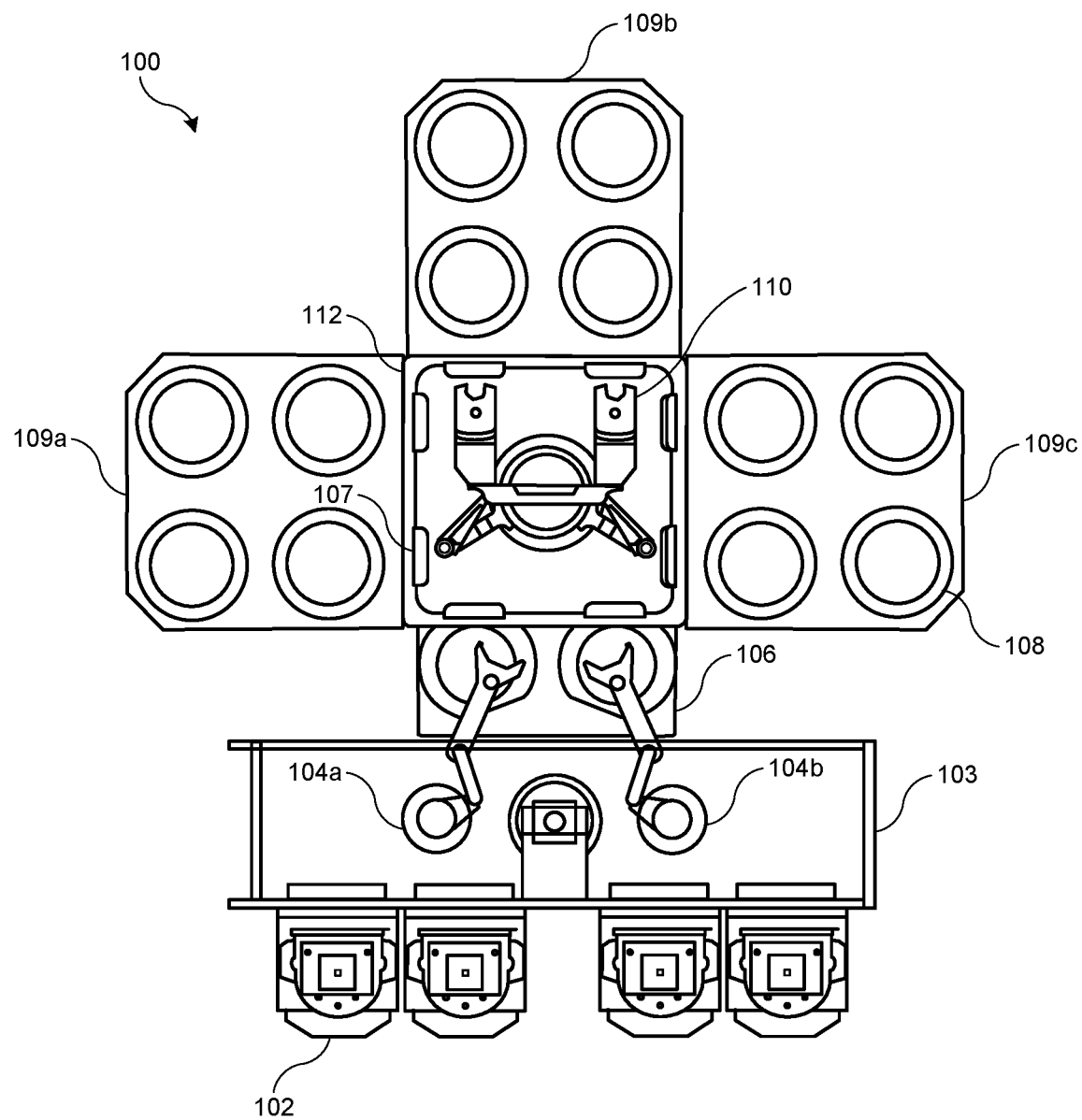
FIG. 1 illustrates a top plan view of a substrate processing tool or processing system of deposition, etching, baking, and curing chambers, according to some embodiments.

FIG. 1 illustrates a top plan view of a substrate processing tool or processing system 100 of deposition, etching, baking, and curing chambers, according to some embodiments. A set of front-opening unified pods 102 may supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems may also be used. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

The second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2A:
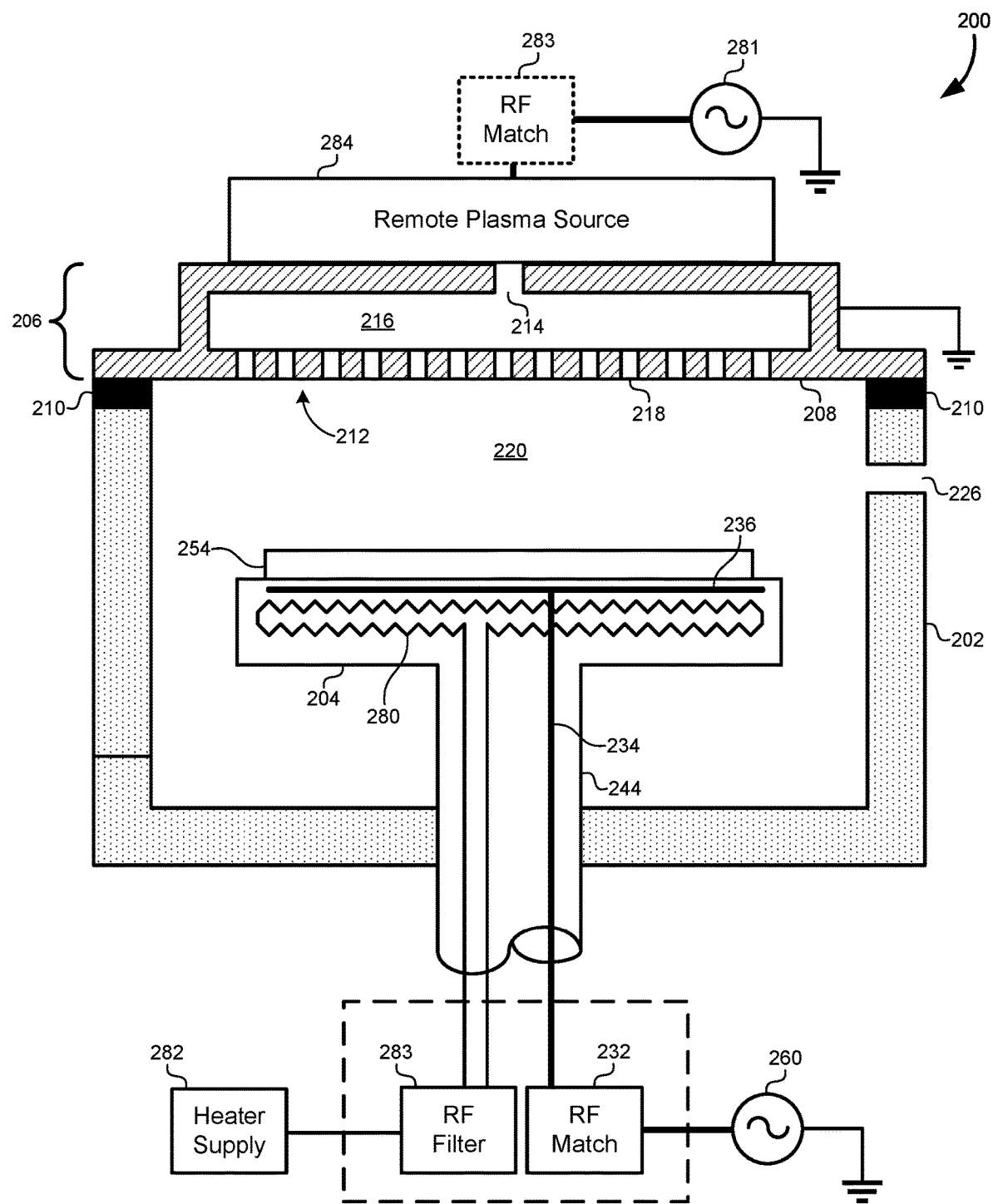
FIG. 2A illustrates a cross-sectional view of a plasma processing chamber, according to some embodiments.

FIG. 2A illustrates a cross-sectional view of a plasma processing chamber 200, according to some embodiments. By way of example, the plasma processing chamber 200 may be described in terms of a plasma-enhanced chemical vapor deposition (PECVD) system. However, any other type of plasma processing chamber may fall within the scope of this disclosure, including other plasma deposition chambers or plasma etch chambers. For example, For example, the plasma processing chamber 200 may be used to perform dry etching with one or more etching agents. The plasma processing chamber 200 may be used for ignition of plasma from a precursor $C_xF_y$ (where x and y represent values for known compounds), $O_2$, $NF_3$, or combinations thereof.

The plasma processing chamber 200 may include a chamber body 202, a lid assembly 206, and a susceptor or pedestal 204. The lid assembly 206 may be positioned at an upper end of the chamber body 202. The pedestal 204 may be disposed inside the chamber body 202, and the lid assembly 206 may be coupled to the chamber body 202 and enclose the pedestal 204 to form a processing volume 220. The chamber body 202 may include a transfer port 226, which may include a slit valve, formed in a sidewall of the chamber body 202. The slit valve opening or transfer port 226 may be selectively opened and closed to allow access to an interior of the processing volume 220 by a substrate handling robot (not shown) for substrate transfer. The transfer port may be configured to facilitate insertion of a substrate 254 into the plasma processing chamber 200, and to facilitate removal of substrate 254 from plasma processing chamber 200.

The lid assembly 206 may include a "showerhead" or gas distributor plate 212 having a plurality of openings 218 for admitting process gas into the processing volume 220. The process gases may be supplied to the plasma processing chamber 200 via a conduit 214 from a gas source. The process gases may enter a gas mixing region 216 prior to flowing through the openings 218. In some implementations, the gas mixing region 216 and referred to as a "gas box" or gases may be mixed and/or evenly distributed before entering the processing volume 220. During operation, the process gases may fill the gas mixing region 216, then pass through the openings 218 formed in the gas distributor plate 212 to uniformly enter the processing volume 220. In alternative embodiments, the process gases may be introduced into the processing volume 220 be inlets and/or nozzles (not shown) distributed within the processing volume 220 in addition to or in lieu of the gas distributor plate 212.

The pedestal 204 may be formed from a metallic or ceramic material. For example, a metal oxide, nitride, or oxide/nitride mixture may be used such as aluminum, aluminum oxide, aluminum nitride, an aluminum oxide/nitride mixture, and/or other similar materials. In typical implementations, one or more pedestal electrodes may be included in the pedestal 204. These electrodes may form a plate, a perforated plate, a mesh, a wire screen, or any other distributed conductive arrangement. These electrodes may be used to secure the substrate 254 to the pedestal 204 through various "chucking" methods, such as monopolar chucking or bipolar chucking.

The pedestal 204 may be coupled to a lift mechanism through a shaft 244, which extends through a bottom surface of the chamber body 202. The lift mechanism may be flexibly sealed to the chamber body 202 by a bellows that prevents vacuum leakage from around the shaft 244. The lift mechanism may allow the pedestal 204 to be moved vertically within the chamber body 202 between a transfer position and a number of process positions to place the substrate 254 in proximity to the gas distributor plate 212.

Some embodiments may also include one or more heating elements 280 in the pedestal 204. The one or more heating elements 280 may include wires with a relatively low internal resistance that generate heat when an electrical current is run through the one or more heating elements 280. For example, some heating elements may have a resistance of less than 10 ohms, such as 2 ohms. Power may be provided to the one or more heating elements 280 by a heater power supply 282, which may be controlled they heater control. The heater control may provide voltage/current settings to the heater power supply 282, to deliver the voltage/current to the one or more heating elements 280 during a processing cycle to heat the pedestal 204. This heat may be transferred to the substrate 254 to bring the substrate 254 into a predetermined temperature range during the process.

The pedestal 204 may also include one or more electrodes 236 configured to deliver RF energy to a plasma in the processing volume 220. For example, a first RF source 260 may be provided outside of the chamber body 202 to provide RF energy to the one or more electrodes 236 in the pedestal 204. The RF energy may be transferred through the one or more electrodes 236 to a gas in the processing volume 220 that is deposited through the gas distributor plate 212 to generate a plasma. The plasma may be maintained above the substrate 254 to, for example, deposit a layer of material on the substrate 254. In order to maximize the power transfer from the first RF source 262 the plasma in the processing volume 220, the RF signal from the first RF source 262 may first pass through an RF matching circuit 232 configured to match an impedance of the plasma. By matching the impedance of the RF matching circuit 232 and the impedance of the plasma, reflections of the RF power may be minimized while maximizing the power transfer to the plasma.

After leaving the RF matching circuit 232, one or more transmission lines 234 may deliver the RF power to the pedestal 204. During the plasma processing operations involving the substrate 254, a capacitively coupled plasma (CCP) may be generated. For example, the one or more electrodes 236 in the pedestal 204 may form capacitive services that capacitively coupled the RF power from the first RF source 262 the plasma in the processing volume 220.

The one or more transmission lines 234 may include coaxial cables and, in some embodiments, may be configured with additional shielding external to these coaxial cables to prevent excessive leakage of RF power to ground. For example, the first RF source 260 may include an RF generator capable of generating RF currents at a frequency of about 13.56 MHz. Alternatively or additionally, first RF source 260 may include a very high frequency (VHF) generator capable of generating VHF power, such as VHF power at frequencies between about 40 MHz to 200 MHz or more.

After passing through the plasma in the processing volume 220, the RF signal may be coupled to the gas distributor plate 212 or other conductive portions of the lid assembly 206. These conductive portions may form an electrode 208 that may be coupled to a ground connection. An isolator 210 may contact the electrode 208 and separate the electrode 208 electrically and thermally from the chamber body 202. The isolator 210 may be constructed using a dielectric material such aluminum oxide, aluminum nitride, and/or other ceramics or metal oxides.

In some embodiments, an RF filter 283 may be included between the heater power supply 282 and the one or more heating elements 280. The RF filter 283 may include a plurality of inductor/capacitor combinations for each input and/or output lead to/from the heater power supply 282. For example, each individual RF filter in the RF filter 283 may include a parallel capacitance (e.g., approximately 50 nF) and a series inductor (e.g., approximately 6 µH) to filter out RF signals on each of these lines.

In addition to generating a capacitively coupled plasma during a plasma-based process being performed on the substrate 254, the plasma processing chamber 200 may be further configured to generate a second plasma during a cleaning process for the processing volume 220. For example, after the substrate 254 has been removed from the processing volume 220, a cleaning process may be initiated to remove residue from the plasma process from the processing volume 220. The cleaning process may involve generating a second plasma that is separate and distinct from the first plasma generated during a process on the substrate 254. For example, the first plasma generated during the process on the substrate 254 may be a capacitively coupled plasma. In contrast, the second plasma generated during the cleaning process after the substrate 254 has been removed from the processing volume 220 may be an inductively coupled plasma. The first and second plasmas may alternatively be distinguished from each other by when they are generated in the processing volume. For example, the first plasma may be generated during a process on the substrate 254, while the second plasma may be generated during a cleaning process after the substrate 254 has been removed.

In order to generate the second plasma, some embodiments may include a second plasma source 284 that is powered by a second RF source 281 that is separate and distinct from the first RF source 260. For example, the second plasma source 284 may include a remote plasma source (RPS) that is located outside of the processing volume 220. The second plasma source 284 may generate the second plasma in the second plasma source 284 and may stream ions into the processing volume 220 during a cleaning process to clean exposed surfaces in the processing volume 220. For example, the first plasma may deposit a thin film on the substrate 254 during a plasma-based deposition process in the plasma processing chamber 200. This process may also leave a thin film deposited on other surfaces within the processing volume 220. After removing the substrate 254, the cleaning process may use the second plasma generated by the second plasma source 284. The gases generated by the second plasma may react with the film on the surfaces of the processing volume 220 such that the film is absorbed by the gases and flushed from the processing volume 220 through a vacuum port.

The second RF source 281 may operate using operating characteristics (e.g., power, waveform, frequency, etc.) that are different from the operating characteristics of the first RF source 260. For example, generating the capacitively coupled plasma may use different RF characteristics than generating the inductively coupled plasma for cleaning. In some embodiments, the second plasma source 284 may include an integrated RF matching circuit that is packaged with the second plasma source 284. Alternatively, some embodiments may use a second RF matching circuit 283 that is used to match the impedance of the remote plasma source 284. The second RF matching circuit 283 is therefore optional and need not be used in all embodiments.

Figure 2B:
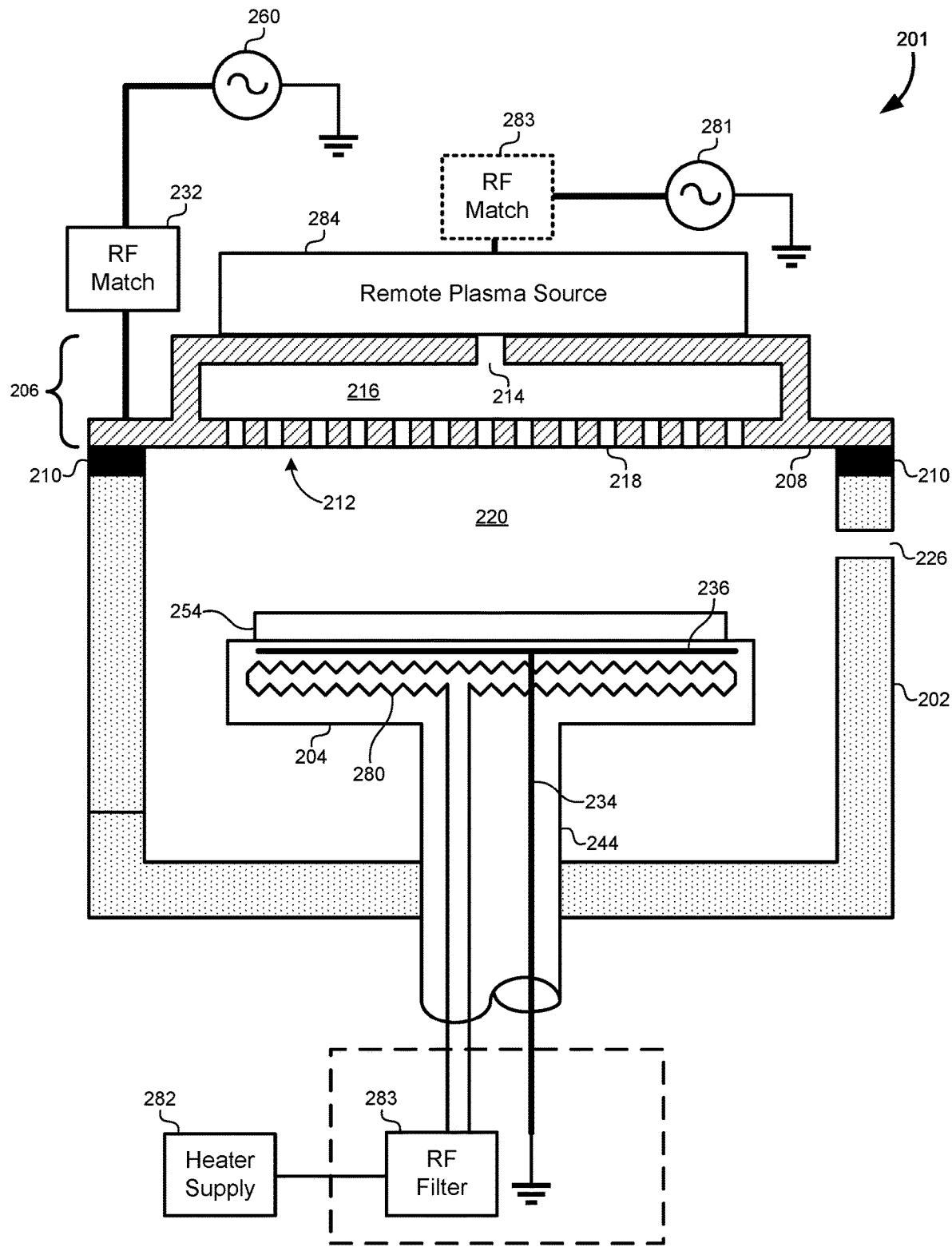
FIG. 2B illustrates a cross-sectional view of a plasma processing chamber, according to some embodiments.

FIG. 2B illustrates a cross-sectional view of a plasma processing chamber 201, according to some embodiments. The configuration of the plasma processing chamber 201 is similar to the configuration of the plasma processing chamber 200 from FIG. 2A, a difference being that the first RF source 260 for generating the capacitively coupled plasma in the processing volume 220 is coupled to the electrode 208 of the gas distributor plate 212 in the lid assembly 206. For example, the first RF source 260 may deliver an RF signal through the RF matching circuit 232 into the electrode 208. This RF signal may generate a capacitively coupled plasma in the processing volume 220 through the one or more electrodes 236 in the pedestal 204. The one or more electrodes 236 in the pedestal 204 may be coupled to a ground connection to complete the RF circuit. Each of the embodiments described herein may be applied equally to configurations where the first RF source 260 that generates the capacitively coupled plasma in the processing volume 220 is coupled to the one or more electrodes 236 in the pedestal 204 and/or to configurations where the first RF source 260 is coupled to the electrode 208 of the gas distributor plate 212 without limitation.

Under normal operations, the first RF source 260 and the second RF source 281 will generally not be powered at the same time. Specifically, the capacitively coupled plasma for performing a plasma-based process on the substrate 254 will be active during the plasma-based process. The second RF source 281 for generating the inductively coupled plasma will be off during the plasma-based process. Conversely, when the second RF source 281 generates the inductively coupled plasma for cleaning the processing volume 220, the first RF source 260 will be generally be off. By leveraging this operational schedule for the first RF source 260 and the second RF source 281, some embodiments may improve the efficiency and design of the plasma processing chamber by using a single RF source to perform both operations. For example, a single RF source may be used to generate a capacitively coupled plasma for the plasma-based processes performed by the plasma processing chamber 201 and to generate an inductively coupled plasma for cleaning the plasma processing chamber 201.

Figure 3:
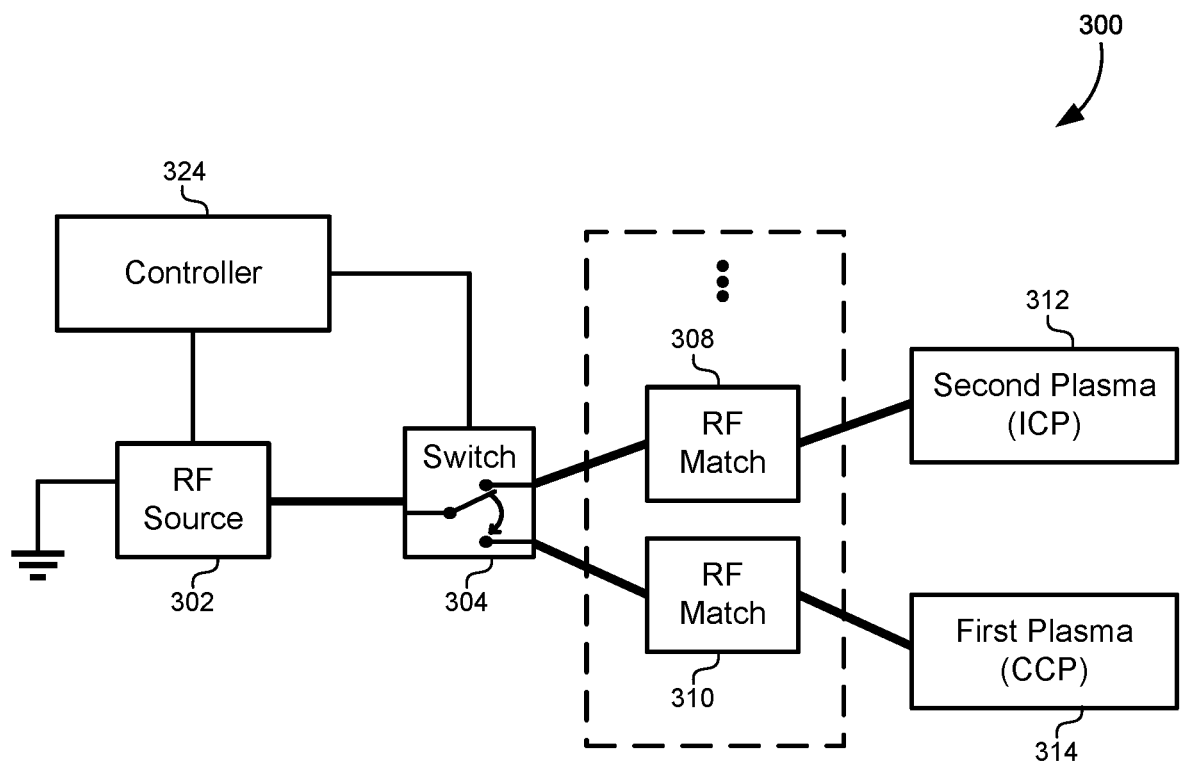
FIG. 3 illustrates a simplified block diagram of a system for using a single RF source to generate plasmas for operating and/or cleaning a plasma processing chamber, according to some embodiments.

FIG. 3 illustrates a simplified block diagram 300 of a system for using a single RF source 302 to generate plasmas for operating and/or cleaning a plasma processing chamber, according to some embodiments. An RF source 302 may be provided that is configured to generate an RF signal that may be used to generate both capacitively coupled plasmas and inductively coupled plasmas. The output of the RF source 302 may be dynamically controlled during operation of the chamber using a controller 324. For example, the controller 324 may provide input to the RF source 302 that changes the frequency and/or power output of the RF source 302. To generate the capacitively coupled plasma, the RF source 302 may be configured to output an RF signal at a frequency of about 13.56 MHz, between about 40 MHz to 200 MHZ, or other frequencies configured to generate the capacitively coupled plasma for the plasma-based process in the chamber. The controller 324 may also cause the RF source 302 to output a different power/frequency used to generate the inductively coupled plasma for cleaning the chamber.

In addition to controlling the output of the RF source 302, the controller 324 may also be configured to operate a switching element 304. The switching element may be implemented using power transistors, relays, and/or other hardware switches. The switching element 304 may be configured to route the RF signal output from the RF source 302 into one or more RF matching circuits. For example, when generating the capacitively coupled plasma for the chamber process performed on the substrate, the switching element 304 may route the RF signal through a first RF matching circuit 310 that is configured to match the impedance of the first plasma 314 generated as a capacitively coupled plasma for the chamber process on the substrate. During a cleaning process, the controller 324 may cause the switching element 304 to route the RF signal from the RF source 302 into a second RF matching circuit 308 that is configured to match the impedance of a second plasma 312 generated as an inductively coupled plasma for cleaning the chamber. As described above, some implementations of the second plasma source 284 may include an integrated RF matching circuit. In these embodiments, the second RF matching circuit 308 may be optional.

The first RF matching circuit 310 and the second RF matching circuit 308 are shown in FIG. 3 as being two separate RF matching circuits. However, other embodiments may use a single RF matching circuit with different settings that allow the single RF matching circuit to match the impedances of both the first plasma 314 and the second plasma 312. The single RF matching circuit may include adjustable capacitances that may be dynamically adjusted during operation to match the impedance of the corresponding plasma, depending on whether the chamber is performing a process on the substrate or undergoing a cleaning operation.

The controller 324 may be implemented by any computer system. For example, the controller 324 may include one or more processors that execute instructions. Instructions may be stored on one or more computer-readable media as a computer program. The controller 324 may be distributed such that multiple computer systems may collectively form the controller 324. For example, a processor coupled to the RF source 302 may execute a portion of the instructions to control the RF source 302, while a separate processor that is coupled to the switching element 304 may execute another portion of the instructions. Alternatively, the controller 324 may be implemented using a server, a workstation, or other centralized computer system that communicates with the RF source 302, the switching element 304, and/or other elements of the system.

Figure 4A:
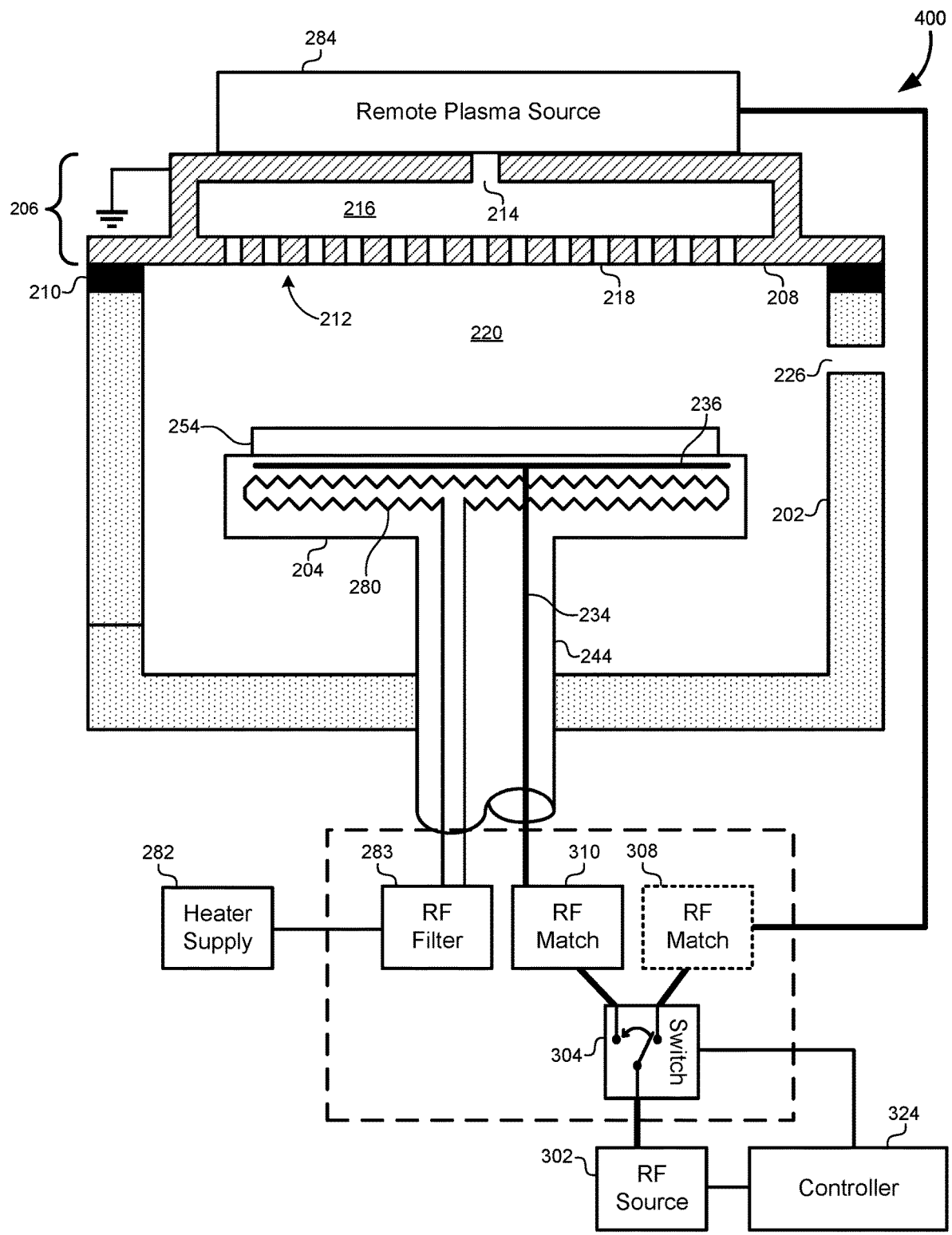
FIG. 4A illustrates a plasma processing chamber that uses an RF source to generate a first plasma for a process on a substrate and a second plasma for cleaning the plasma processing chamber, according to some embodiments.

FIG. 4A illustrates a plasma processing chamber 400 that uses an RF source 302 to generate a first plasma for a process on a substrate 254 and a second plasma for cleaning the plasma processing chamber 400, according to some embodiments. As described above in FIG. 3, the RF source 302 and the switching element 304 may be controlled by the controller 324. During a plasma-based process on the substrate 254, the switching element 304 may deliver RF power through the first RF matching circuit 310 into the one or more electrodes 236 in the pedestal 204. As described above in relation to FIG. 2A, this RF signal may generate a capacitively coupled plasma in the processing volume 220 to, for example, deposit a thin film on the substrate 254. The RF signal may continue through the electrode 208 to a ground connection.

When the substrate 254 is removed from the processing volume 220, the plasma processing chamber 400 may begin a cleaning process. Instead of using a dedicated RF source, the second plasma source 284 may receive an RF signal from the RF source 302 previously used during the plasma-based process on the substrate 254. The controller 324 may cause the RF source 302 to generate an RF signal having a power output and frequency that is compatible with the second plasma source 284 to generate an inductively coupled plasma for the cleaning process. The controller 324 may also cause the switching element 304 to route the output RF signal from the RF source 302 through the second RF matching circuit 308 into the remote plasma source 284. As described above in relation to FIG. 2A, the second plasma source 284 may generate an inductively coupled plasma that is used to clean surfaces inside the processing volume 220.

The plasma processing chamber 400 may execute a plurality of plasma-based processes on various substrates between cleaning cycles. Therefore, the controller 324 may cause the RF source 302 to send RF signals through the first RF matching circuit 310 to generate capacitively coupled plasmas through the one or more electrodes 236 in the chamber multiple times before switching to instead power the second plasma source 284. The instructions that control the operation of the controller 324 may be part of a recipe that is executed on a batch of substrates between cleaning processes.

The switching element 304 the first RF matching circuit 310 and/or the second RF matching circuit 308 may be housed in a filter box, which may be shared with the RF filter 283. Alternatively, any of these components may be individually packaged outside of the filter box.

Figure 4B:
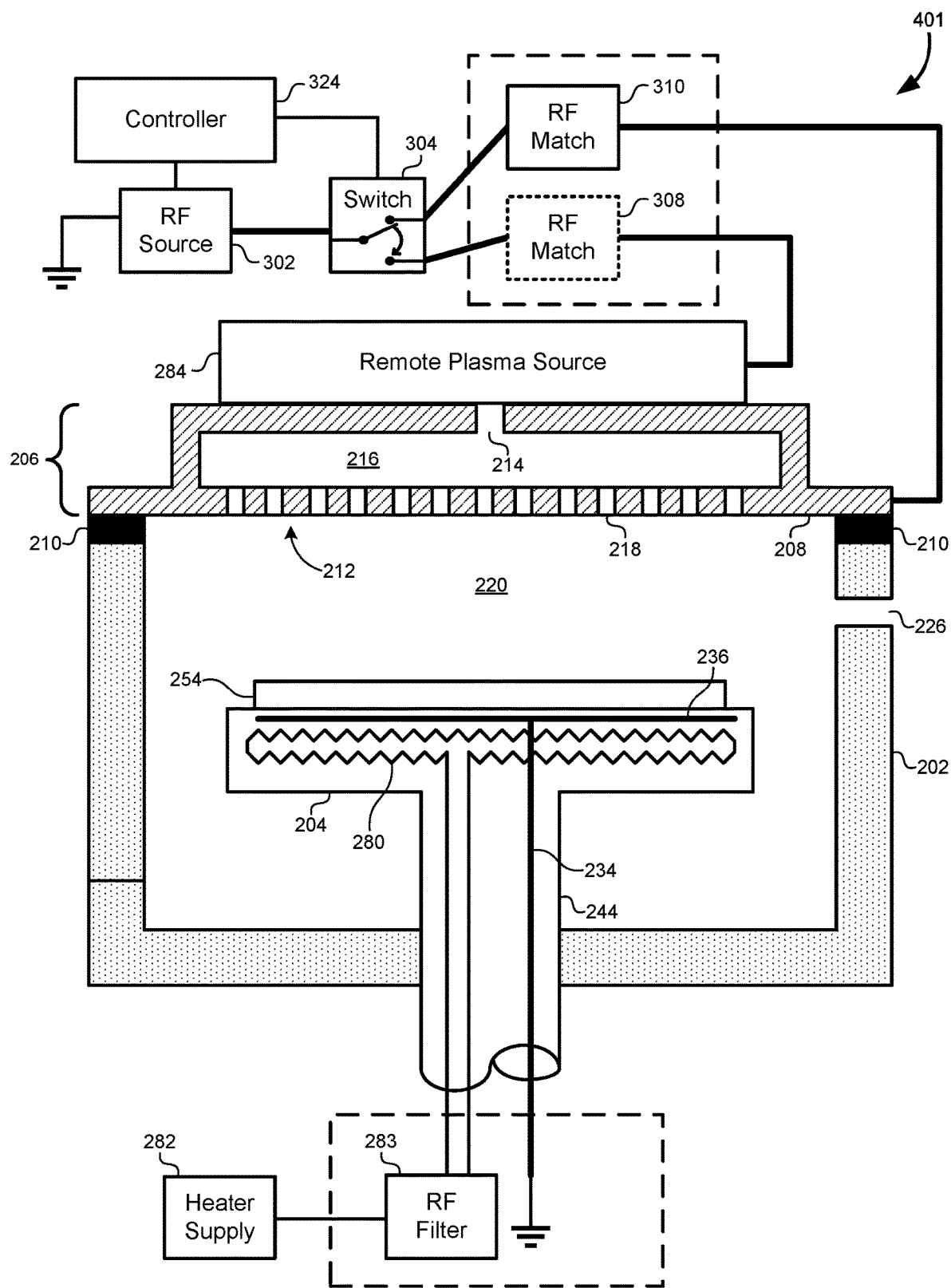
FIG. 4B illustrates a plasma processing chamber that uses an RF source coupled to the lid assembly of the plasma processing chamber, according to some embodiments.

FIG. 4B illustrates a plasma processing chamber 401 that uses an RF source 302 coupled to the lid assembly 206 of the plasma processing chamber 401, according to some embodiments. The plasma processing chamber 401 is similar to the plasma processing chamber 400 in FIG. 4A, a difference being that the RF source 302 and the first RF matching circuit 310 are coupled to the electrode 208 on the lid assembly 206 of the plasma processing chamber 401. As described above in relation to FIG. 2B, this configuration reverses the pathway of the RF signal from the RF source 302 through the processing volume 220 during a plasma-based process on the substrate 254. The operation of the controller 324, the switching element 304, and the RF matching circuits 310, 308 may function as described above in relation to FIG. 4A in the opposite direction.

Figure 5A:
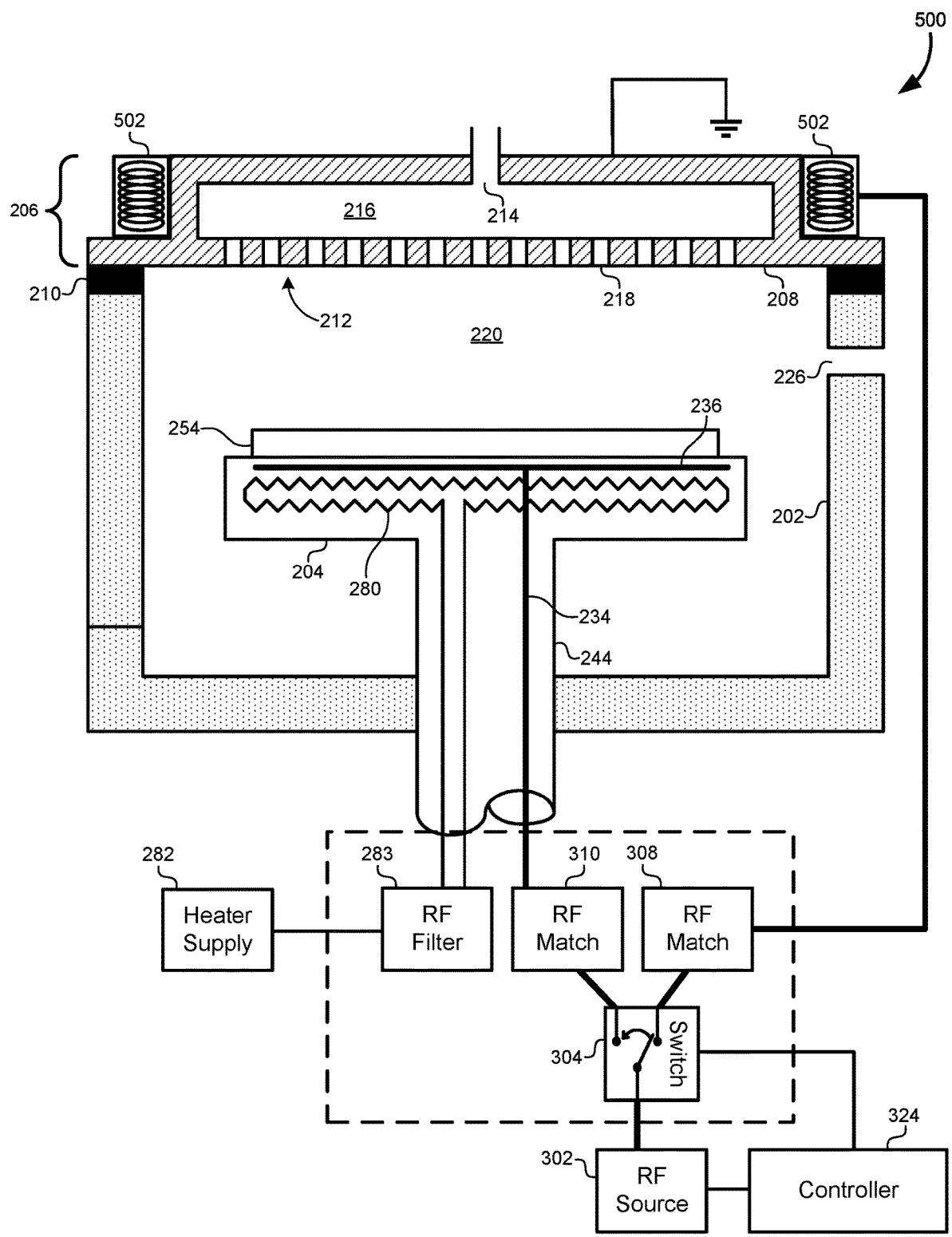
FIG. 5A illustrates a plasma processing chamber that uses an RF source that generates the inductively coupled plasma for the cleaning process in the gas mixing region, according to some embodiments.
Figure 5B:
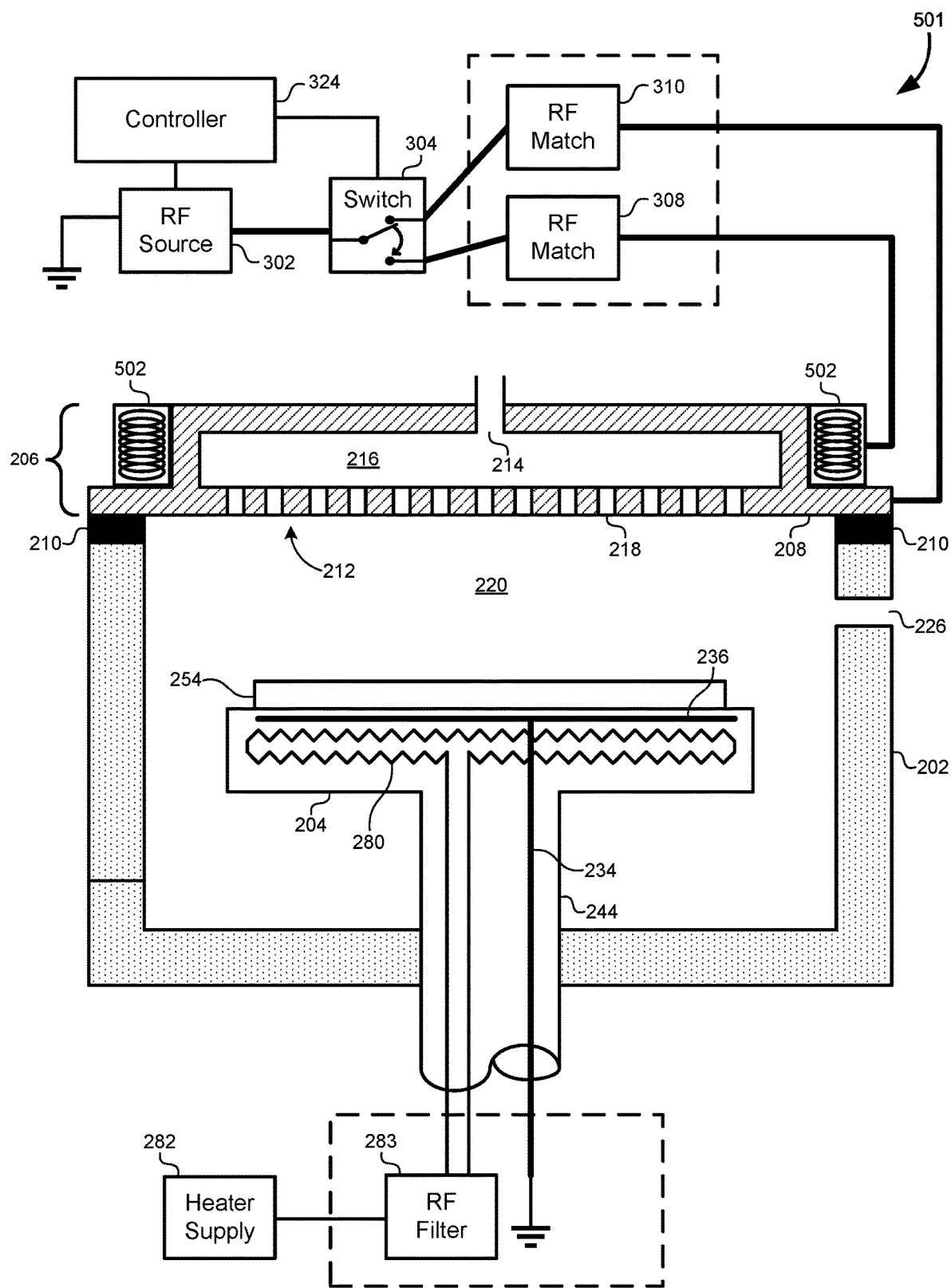
FIG. 5B illustrates a plasma processing chamber using a reverse configuration where the RF source is coupled to the lid assembly for generating the capacitively coupled plasma in the opposite direction.

FIG. 5A illustrates a plasma processing chamber 500 that uses an RF source 302 that generates the inductively coupled plasma for the cleaning process in the gas mixing region 216, according to some embodiments. The controller 324 may control the RF source 302 and switching element 304 to deliver an RF signal through the first RF matching circuit 310 to generate the capacitively coupled plasma in the processing volume 220 as described above. However, in order to generate the inductively coupled plasma during the cleaning process, the RF signal delivered to the second RF matching circuit 308 may be coupled to inductive coils 502 that are distributed around the gas mixing region 216 of the lid assembly. For example, the inductive coils 502 may be placed between a showerhead and a gas box of the plasma processing chamber 500. The RF signal may pass through the inductive coils 502 to generate the inductively coupled plasma in the gas box to be distributed into the processing volume 220 to clean the plasma processing chamber 500. These embodiments may effectively eliminate the need for a remote plasma generator to be separately included plasma processing chamber 500. FIG. 5B illustrates a plasma processing chamber 501 using a reverse configuration where the RF source 302 is coupled to the lid assembly 206 for generating the capacitively coupled plasma in the opposite direction as described in FIG. 4B.

Figure 6A:
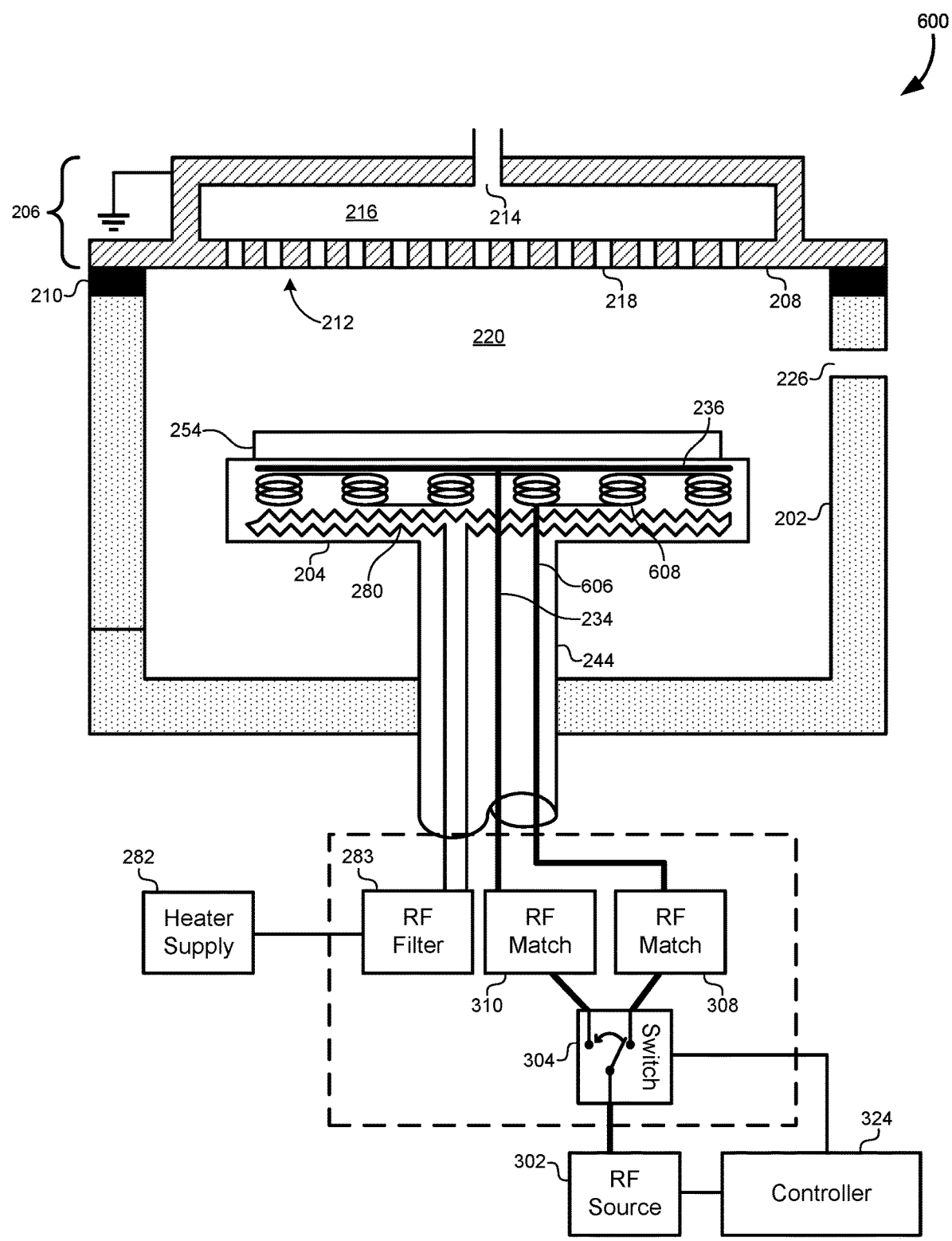
FIG. 6A illustrates a plasma processing chamber where the RF source generates capacitively coupled plasmas and inductively coupled plasmas through the pedestal, according some embodiments.
Figure 6B:
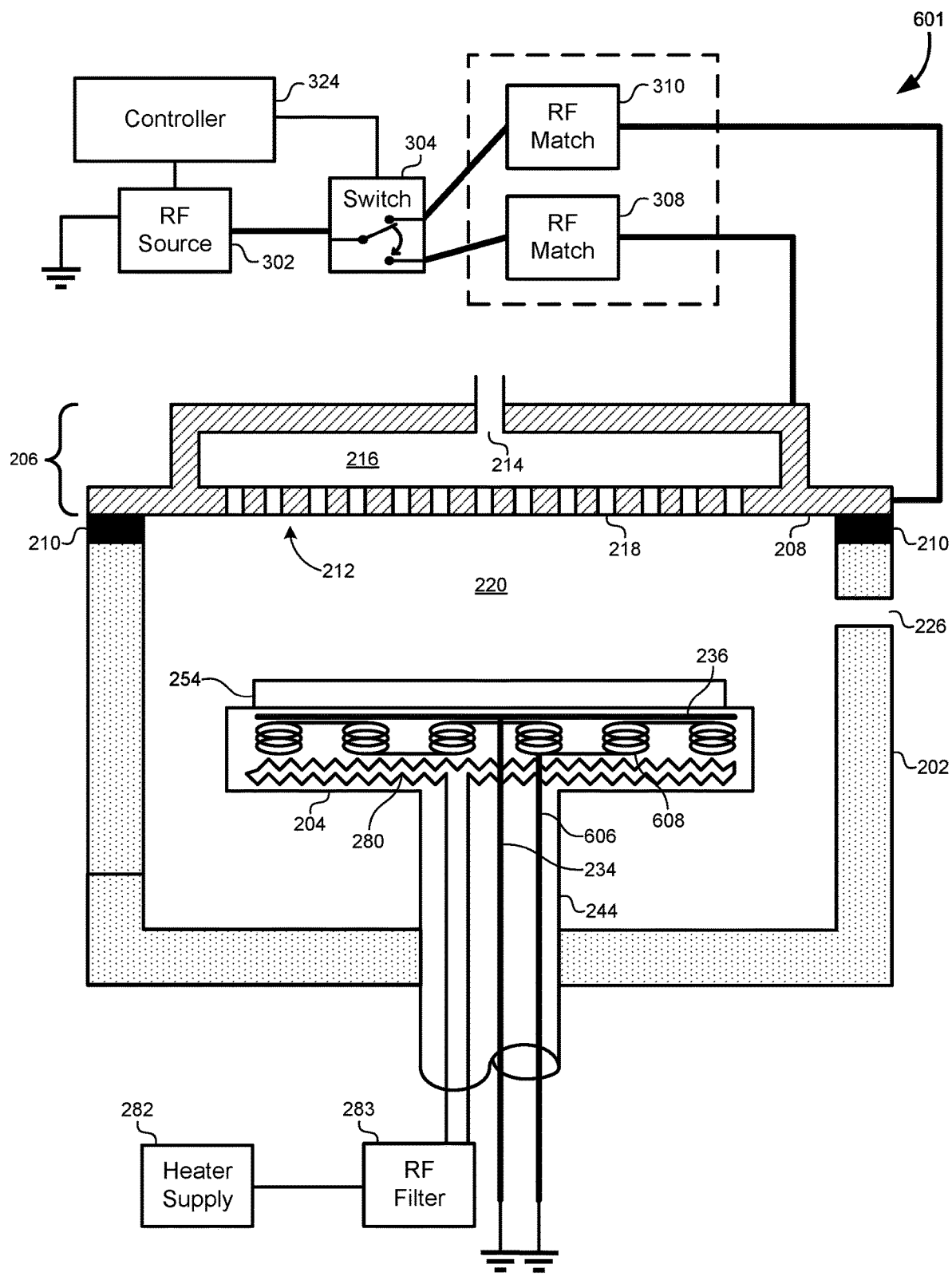
FIG. 6B illustrates a plasma processing chamber using a reverse configuration where the RF source is coupled to the lid assembly, according to some embodiments.

FIG. 6A illustrates a plasma processing chamber 601 where the RF source 302 generates capacitively coupled plasmas and inductively coupled plasmas through the pedestal 204, according some embodiments. Instead of placing the coils around the gas mixing region 216, this configuration may embed inductive coils 608 in the pedestal 204. The inductive coils 608 may coexist in the pedestal 204 with the one or more electrodes 236 that generate the capacitively coupled plasma, along with the one or more heating elements 280 used to heat the substrate 254. The inductive coils 608 may receive the RF signal from the second RF matching circuit 308 to generate an inductively coupled plasma in the processing volume 220 during a cleaning process. Therefore, the RF source 302 may alternately power either the one or more electrodes 236 to generate the capacitively coupled plasma or the inductive coils 608 to generate the inductively coupled plasma, depending on the type of process (e.g., deposition, etch, cleaning) taking place in the plasma processing chamber 600. FIG. 6B illustrates a plasma processing chamber 601 using a reverse configuration where the RF source 302 is coupled to the lid assembly 206, according to some embodiments.

Figure 7:
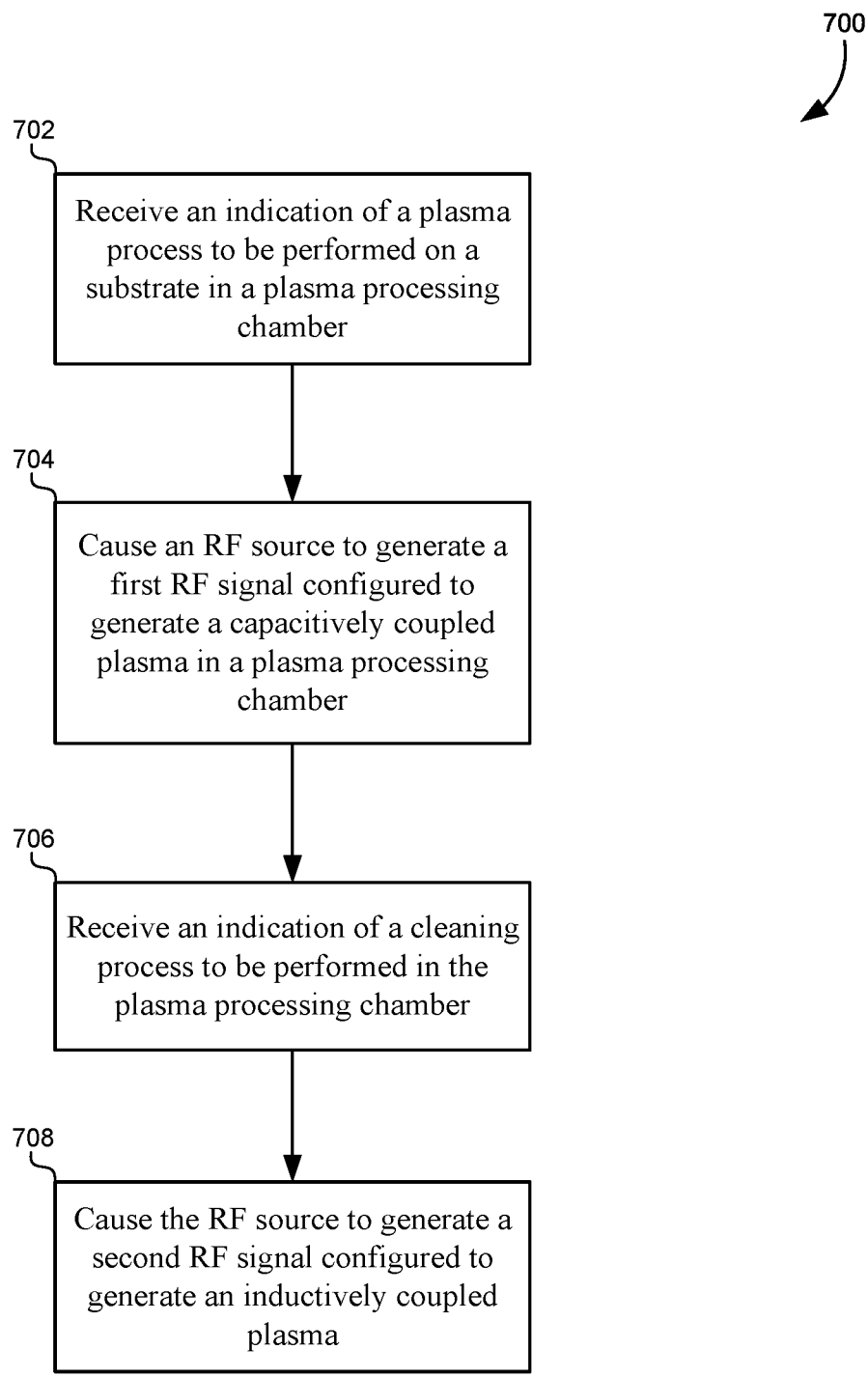
FIG. 7 illustrates a flowchart of a method for using a single RF source to generate inductively coupled plasmas and capacitively coupled plasmas in a plasma processing chamber, according to some embodiments.

FIG. 7 illustrates a flowchart 700 of a method for using a single RF source to generate inductively coupled plasmas and capacitively coupled plasmas in a plasma processing chamber, according to some embodiments. Alternatively, the plasmas may be distinguished as a plasma used to perform a process on a substrate in contrast to a plasma used to clean the plasma processing chamber. This method may be carried out by a controller having processors that execute instructions to perform these operations. Additionally, this method may be performed by the RF source, the switching element, and the other components of the plasma processing system.

The method may include receiving an indication of a plasma process to be performed on a substrate in a plasma processing chamber (702). For example, a controller may receive a recipe or an instruction indicating that a plasma process is to be performed. This may include a deposition process, an etch process, and/or any other plasma-based process. The recipe may indicate settings for the RF source, such as a power level, a frequency, a duty cycle, timing, and/or any other operating characteristic of the RF source.

The method may also include causing the RF source to generate a first RF signal configured to generate a capacitively coupled plasma in the plasma processing chamber during the plasma process being performed on the substrate (704). For example, the controller may generate an output that causes the RF source to generate the specified RF output. The controller may also generate an output that causes a switching element to direct the first RF signal through the switching element to electrodes in a pedestal or a lid assembly of the plasma processing chamber. The first RF signal may be configured to generate a capacitively conductive plasma based on its operating characteristics (e.g., frequency, power output, etc.) and/or based on how the first RF signal is routed to electrodes in the plasma processing chamber. The capacitively coupled plasma may be used to remove or deposit material on a substrate in the plasma processing chamber.

The method may additionally include receiving an indication of a cleaning process to be performed in the plasma processing chamber (706). The cleaning process may be executed between processes performed on substrates in the plasma processing chamber. The cleaning process may use an inductively coupled plasma in contrast to the capacitively coupled plasma used by the plasma process performed on the substrate. Additionally, the cleaning process may be executed when a substrate has been removed from the chamber and after a film has built up on surfaces in the processing volume of the chamber. The indication of the cleaning process may be received by the controller as an input from a user, as part of a sequence of recipes to be performed on batches of substrates with intermittent cleaning processes, by an automated process that detects when the plasma processing chamber requires cleaning, or by any other input means.

The method may further include causing the RF source to generate a second RF signal configured to generate an inductively coupled plasma in the plasma processing chamber during the cleaning process (708). For example, the controller may provide operating settings to the RF source to begin generating the second RF signal. The operating settings provided to the RF source may be different from the operating settings provided to generate the first RF signal. Therefore, the second RF signal may be configured to generate the inductively coupled plasma based on the operating settings of the RF source and/or based on the second RF signal being routed to inductive coils that generate the inductively coupled plasma. Note that the same RF source may be used to generate both the inductively coupled plasma in the capacitively coupled plasma.

It should be appreciated that the specific steps illustrated in FIG. 7 provide particular methods of using a single RF source to generate inductively coupled plasmas and capacitively coupled plasmas in a plasma processing chamber according to various embodiments. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 8:
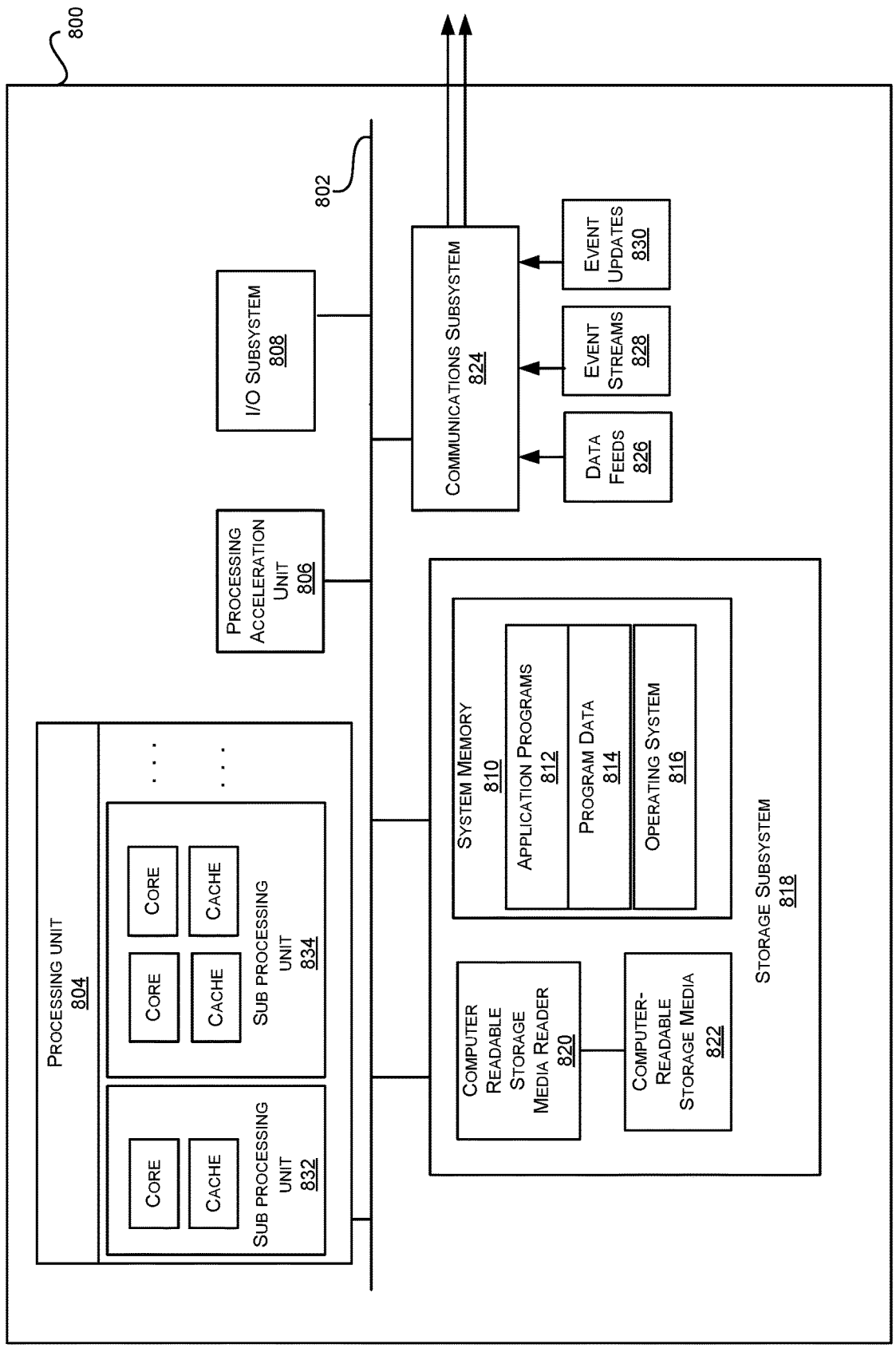
FIG. 8 illustrates an exemplary computer system, in which various embodiments may be implemented.

FIG. 8 illustrates an exemplary computer system 800, in which various embodiments may be implemented. The system 800 may be used to implement any of the computer systems described above. As shown in the figure, computer system 800 includes a processing unit 804 that communicates with a number of peripheral subsystems via a bus subsystem 802. These peripheral subsystems may include a processing acceleration unit 806, an I/O subsystem 808, a storage subsystem 818 and a communications subsystem 824. Storage subsystem 818 includes tangible computer-readable storage media 822 and a system memory 810.

Bus subsystem 802 provides a mechanism for letting the various components and subsystems of computer system 800 communicate with each other as intended. Although bus subsystem 802 is shown schematically as a single bus, alternative embodiments of the bus subsystem may utilize multiple buses. Bus subsystem 802 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 804, which can be implemented as one or more integrated circuits (e.g., a conventional microprocessor or microcontroller), controls the operation of computer system 800. One or more processors may be included in processing unit 804. These processors may include single core or multicore processors. In certain embodiments, processing unit 804 may be implemented as one or more independent processing units 832 and/or 834 with single or multicore processors included in each processing unit. In other embodiments, processing unit 804 may also be implemented as a quad-core processing unit formed by integrating two dual-core processors into a single chip.

In various embodiments, processing unit 804 can execute a variety of programs in response to program code and can maintain multiple concurrently executing programs or processes. At any given time, some or all of the program code to be executed can be resident in processor(s) 804 and/or in storage subsystem 818. Through suitable programming, processor(s) 804 can provide various functionalities described above. Computer system 800 may additionally include a processing acceleration unit 806, which can include a digital signal processor (DSP), a special-purpose processor, and/or the like.

I/O subsystem 808 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 800 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 800 may comprise a storage subsystem 818 that comprises software elements, shown as being currently located within a system memory 810. System memory 810 may store program instructions that are loadable and executable on processing unit 804, as well as data generated during the execution of these programs.

Depending on the configuration and type of computer system 800, system memory 810 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 804. In some implementations, system memory 810 may include multiple different types of memory, such as static random access memory (SRAM) or dynamic random access memory (DRAM). In some implementations, a basic input/output system (BIOS), containing the basic routines that help to transfer information between elements within computer system 800, such as during start-up, may typically be stored in the ROM. By way of example, and not limitation, system memory 810 also illustrates application programs 812, which may include client applications, Web browsers, mid-tier applications, relational database management systems (RDBMS), etc., program data 814, and an operating system 816. By way of example, operating system 816 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 818 may also provide a tangible computer-readable storage medium for storing the basic programming and data constructs that provide the functionality of some embodiments. Software (programs, code modules, instructions) that when executed by a processor provide the functionality described above may be stored in storage subsystem 818. These software modules or instructions may be executed by processing unit 804. Storage subsystem 818 may also provide a repository for storing data used in accordance with some embodiments.

Storage subsystem 800 may also include a computer-readable storage media reader 820 that can further be connected to computer-readable storage media 822. Together and, optionally, in combination with system memory 810, computer-readable storage media 822 may comprehensively represent remote, local, fixed, and/or removable storage devices plus storage media for temporarily and/or more permanently containing, storing, transmitting, and retrieving computer-readable information.

Computer-readable storage media 822 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 800.

By way of example, computer-readable storage media 822 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 822 may include, but is not limited to, Zip® drives, flash memory cards, universal serial bus (USB) flash drives, secure digital (SD) cards, DVD disks, digital video tape, and the like. Computer-readable storage media 822 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 800.

Communications subsystem 824 provides an interface to other computer systems and networks. Communications subsystem 824 serves as an interface for receiving data from and transmitting data to other systems from computer system 800. For example, communications subsystem 824 may enable computer system 800 to connect to one or more devices via the Internet. In some embodiments communications subsystem 824 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 824 can provide wired network connectivity (e.g., Ethernet) in addition to or instead of a wireless interface.

In some embodiments, communications subsystem 824 may also receive input communication in the form of structured and/or unstructured data feeds 826, event streams 828, event updates 830, and the like on behalf of one or more users who may use computer system 800.

By way of example, communications subsystem 824 may be configured to receive data feeds 826 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 824 may also be configured to receive data in the form of continuous data streams, which may include event streams 828 of real-time events and/or event updates 830, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 824 may also be configured to output the structured and/or unstructured data feeds 826, event streams 828, event updates 830, and the like to one or more databases that may be in communication with one or more streaming data source computers coupled to computer system 800.

Computer system 800 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 800 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A system comprising:
    a plasma processing chamber;
    a Radio-Frequency (RF) source; and
    a controller configured to perform operations comprising:
        receiving an indication of a plasma process to be performed on a substrate in the plasma processing chamber;
        causing the RF source to generate a first RF signal configured to generate a capacitively coupled plasma in the plasma processing chamber during the plasma process performed on the substrate;
        receiving an indication of a cleaning process to be performed in the plasma processing chamber; and
        causing the RF source to generate a second RF signal configured to generate an inductively coupled plasma in the plasma processing chamber during the cleaning process.

2. The system of claim 1, further comprising a switching element coupled to an output of the RF source.

3. The system of claim 2, wherein the operations performed by the controller further comprise:
    causing the switching element to route the first RF signal to one or more electrodes in a pedestal of the plasma processing chamber during the plasma process performed on the substrate to generate the capacitively coupled plasma.

4. The system of claim 2, wherein the operations performed by the controller further comprise:
    causing the switching element to route the second RF signal to inductive coils during the cleaning process to generate the inductively coupled plasma.

5. The system of claim 1, further comprising a remote plasma generator, wherein the second RF signal is routed to the remote plasma generator to generate the inductively coupled plasma.

6. The system of claim 1, further comprising inductive coils positioned around a gas mixing region of the plasma processing chamber, wherein the second RF signal is routed to the inductive coils to generate the inductively coupled plasma in the gas mixing region.

7. The system of claim 1, further comprising inductive coils positioned in a pedestal of the plasma processing chamber, wherein the second RF signal is routed to the inductive coils to generate the inductively coupled plasma in a processing volume of the plasma processing chamber.

8. The system of claim 1, further comprising a first RF matching circuit configured to match an impedance of the capacitively coupled plasma during the plasma process performed on the substrate, wherein the first RF signal is routed through the first RF matching circuit.

9. The system of claim 8, further comprising a second RF matching circuit configured to match an impedance of the inductively coupled plasma during the cleaning process, wherein the second RF signal is routed through the second RF matching circuit.

10. The system of claim 1, further comprising an RF matching circuit, wherein the operations performed by the controller further comprise:
causing the RF matching circuit to match impedance of either the inductively coupled plasma or the capacitively coupled plasma depending on whether the plasma process is being performed on the substrate or the cleaning process is being executed.

11. A method of using a single Radio-Frequency (RF) source to generate inductively coupled plasmas and capacitively coupled plasmas in plasma processing chambers, the method comprising:
receiving an indication of a plasma process to be performed on a substrate in a plasma processing chamber;
causing an RF source to generate a first RF signal configured to generate a capacitively coupled plasma in the plasma processing chamber during the plasma process performed on the substrate;
receiving an indication of a cleaning process to be performed in the plasma processing chamber; and
causing the RF source to generate a second RF signal configured to generate an inductively coupled plasma in the plasma processing chamber during the cleaning process.

12. The method of claim 11, wherein the first RF signal is routed to an electrode in a lid assembly of the plasma processing chamber.

13. The method of claim 12, wherein a pedestal of the plasma processing chamber comprises a ground connection through which the first RF signal is grounded after generating the capacitively coupled plasma.

14. The method of claim 11, wherein the RF source is shared between a plurality of plasma processing chambers.

15. The method of claim 11, wherein the RF source generates both the capacitively coupled plasma and the inductively coupled plasma without requiring an additional RF source.

16. One or more non-transitory computer-readable media comprising instructions that, when executed by one or more processors, cause the one or more processors to perform operations comprising:
receiving an indication of a plasma process to be performed on a substrate in a plasma processing chamber;
causing a Radio-Frequency (RF) source to generate a first RF signal configured to generate a capacitively coupled plasma in the plasma processing chamber during the plasma process performed on the substrate;
receiving an indication of a cleaning process to be performed in the plasma processing chamber; and
causing the RF source to generate a second RF signal configured to generate an inductively coupled plasma in the plasma processing chamber during the cleaning process.

17. The one or more non-transitory computer-readable media of claim 16, wherein the one or more processors are distributed between different computing systems.

18. The one or more non-transitory computer-readable media of claim 16, wherein the instructions are part of one or more recipes executed on a batch of substrates in the plasma processing chamber.

19. The one or more non-transitory computer-readable media of claim 16, wherein the operations further comprise:
causing a switching element to route the first RF signal to one or more electrodes in a pedestal of the plasma processing chamber during the plasma process performed on the substrate to generate the capacitively coupled plasma; and
causing the switching element to route the second RF signal to inductive coils or a remote plasma generator during the cleaning process to generate the inductively coupled plasma.

20. The one or more non-transitory computer-readable media of claim 16, wherein the operations further comprise:
causing one or more RF matching circuits to match an impedance of either the inductively coupled plasma or the capacitively coupled plasma depending on whether the plasma process is being performed on the substrate or the cleaning process is being executed.

* * * * *